United States Patent
Lee et al.

(10) Patent No.: US 11,533,023 B2
(45) Date of Patent: Dec. 20, 2022

(54) EMBEDDED TRANSMIT/RECEIVE SWITCH

(71) Applicant: International Business Machines Corporation, Armonk, NY (US)

(72) Inventors: Wooram Lee, Briarcliff Manor, NY (US); Bodhisatwa Sadhu, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/239,527

(22) Filed: Apr. 23, 2021

(65) Prior Publication Data

US 2022/0345092 A1 Oct. 27, 2022

(51) Int. Cl.
*H04B 1/44* (2006.01)
*H03F 1/42* (2006.01)
(Continued)

(52) U.S. Cl.
CPC .................. *H03F 1/42* (2013.01); *H03F 1/56* (2013.01); *H03F 3/245* (2013.01); *H04B 1/44* (2013.01);
(Continued)

(58) Field of Classification Search
None
See application file for complete search history.

(56) References Cited

U.S. PATENT DOCUMENTS 6,226,275 B1 5/2001 Yang et al.
9,246,535 B2 1/2016 Jerng et al.
(Continued)

FOREIGN PATENT DOCUMENTS

CN 102143100 A 8/2011
CN 103187987 7/2013
(Continued)

OTHER PUBLICATIONS

Alberto Valdes-Garcia et al., "A Fully-integrated Dual-Polarization 16-Element W-band Phased Array Transceiver in SiGe BiCMOS", IBM T. J. Watson Research Center, Yorktown Heights, N.Y., USA, RTU2C-5, 978-1-4673-6062-3/13/2013 IEEE.
(Continued)

*Primary Examiner* — Pablo N Tran
(74) *Attorney, Agent, or Firm* — Daniel P. Morris; Erik Johnson; Lou Percello, Attorney, PLLC

(57) ABSTRACT

A TX/RX switch includes a power amplifier (PA), a Low Noise Amplifier (LNA), and an antenna connection. The PA is connected to a PA matching network that has a PA network impedance and a common PA-LNA impedance connected in one or more series-parallel combinations in different embodiments in a transmitting mode. The LNA is connected to a LNA matching network that has a LNA. network impedance and the same common PA-LNA impedance connected in one or more series-parallel combinations in a receive mode. A mode switch can connect the common PA-LNA impedance in different configurations to enable the transmitting and receiving mode respectively. In some embodiments, the mode switch can short or open circuit the connection of the PA matching circuit or the LNA matching circuit to the antenna. In some embodiments, the mode switch can also turn power on or off to the PA or the LNA when the switch is in a mode where the respective amplifier is not selected. Accordingly, with specific design limitations on the common PA-LNA impedance combined with different mode switch configurations of the TX/RX switch components in either the TX or RX mode, the TX/RX switch operates within a design bandwidth without, transmission lines embedded in the TX/RX switch circuitry and provides optimum power transfer from/to the antenna at the antenna connection with reduced noise.

19 Claims, 10 Drawing Sheets

(51) Int. Cl.
  *H03F 1/56* (2006.01)
  *H03F 3/24* (2006.01)
  *H04B 1/48* (2006.01)
(52) U.S. Cl.
  CPC .. *H03F 2200/222* (2013.01); *H03F 2200/294* (2013.01); *H03F 2200/36* (2013.01); *H03F 2200/387* (2013.01); *H03F 2200/451* (2013.01)

(56) References Cited

U.S. PATENT DOCUMENTS

| | | | | |
|---|---|---|---|---|
| 9,559,747 | B1* | 1/2017 | Valdes Garcia | H04B 17/102 |
| 9,882,601 | B1* | 1/2018 | Feldman | H04B 1/44 |
| 9,917,659 | B2 | 3/2018 | Valdes Garcia et al. | |
| 10,141,971 | B1 | 11/2018 | Elkholy et al. | |
| 10,693,231 | B2 | 6/2020 | Dunworth et al. | |
| 2011/0273248 | A1* | 11/2011 | Nicolson | H03H 7/25 333/81 A |
| 2013/0331043 | A1* | 12/2013 | Perumana | H04B 1/525 455/78 |
| 2014/0213200 | A1* | 7/2014 | Brinkhoff | H04B 1/48 455/83 |
| 2014/0323065 | A1 | 10/2014 | Lei | |
| 2015/0222318 | A1 | 8/2015 | Jerng et al. | |
| 2016/0336972 | A1 | 11/2016 | Khlat et al. | |
| 2020/0044681 | A1 | 2/2020 | Yokoyama et al. | |
| 2020/0169285 | A1 | 5/2020 | Malekzadeh et al. | |
| 2020/0252115 | A1 | 8/2020 | Paramesh et al. | |
| 2020/0366332 | A1 | 11/2020 | Yokoyama et al. | |

FOREIGN PATENT DOCUMENTS

| | | | |
|---|---|---|---|
| CN | 103187987 | A | 7/2013 |
| CN | 108063627 | A | 5/2018 |
| CN | 209448740 | U | 9/2019 |

OTHER PUBLICATIONS

Wonho Lee and Songcheol Hong, "28 GHz RF Front-End Structure Using CG LNA as a Switch", IEEE Microwave and Wireless Components Letters, 1531-1309 2019 IEEE.

Sadhu, et al., "A 28 GHz 32-Element Phased-Array Transceiver IC with Concurrent Dual Polarized Beams and 1.4 Degree Beam-Steering Resolution for 5G Communication", ISSCC 2017 Session 7 Wireless Transceivers/7.2.

Sadhu, et al., "A 28-GHz 32-Element TRX Phased-Array IC With Concurrent Dual-Polarized Operation and Orthogonal Phase and Gain Control for 5G Communications", IEEE Journal of Solid-State Circuits, vol. 52, No. 12, Dec. 2017.

Alberto Valdes-Garcia, et al., "Circuit and Antenna-in-Package Innovations for Scaled mmWave 5G Phased Array Modules",978-1-5386-2483-8/18/2018 IEEE.

Fatih Golcuk, et al., A 90-100-GHz 4×4 SiGe BiCMMOS Polarimetric Transmit/Receive Phased Array With Simultaneous Receive-Beams Capabilities, IEEE Transactions on Microwave Theory and Techniques, vol. 61, No. 8 Aug. 2013.

Schmid et al., "On the Analysis and Design of Low-Loss Single-Pole Double-Throw W-Band Switches Utilizing Saturated SiBe HBTs", IEEE Transactions on Microwave Theory and Techniques, vol. 60, No. 11, Nov. 2014.

Fatih Golcuk, et al., "A 90-100-GHz 4×4 SiBe BiCMOS Polarimetric Transmit/Receive Phased Array With Simultaneous Receive-Beams Capabilities", IEEE Transactions on Microwave Theory and Techniques, vol. 61, No. 8, Aug. 2013.

Arun Natarajan, et al., W-Band Dual-Polarization Phased-Array Transceiver Front-End in SiGe BiCMOS, IEEE Transactions on Microwave Theory and Techniques, vol. 63, No. 6, Jun. 2015.

Hong-Teuk Kim, et al., "A 28-GHz CMOS Direct Conversion Transceiver With Packaged 2×4 Antenna Array for 5G Cellular Systems", IEEE Journal of Solid-State Circuits, vol. 53, No. 5, May 2018.

Patent Cooperation Treaty (PCT) International Search Report (ISR) and Written Opinion (WO) dated (date of mailing) Jul. 20, 2022, Authorized officer Peng, Liang.

* cited by examiner

EMBEDDED TRANSMIT/RECEIVE SWITCH

BACKGROUND

The present invention relates to antenna switches, and more specifically, the invention relates to an antenna switch, i.e., a TX/RX switch, that switches a single antenna back and forth from a transmit to a receive mode in a high frequency circuit.

A TX/RX switch is used to select/change a connection between a single antenna and a transmitter, receiver, or transceiver. For example, in a transmitting (TX) mode, the TX/RX switch connects the antenna to a transmitter or transceiver, i.e., to a power amplifier (PA) at the output of the transmitter or transceiver. In the receiving/reception mode, the TX/RX switch connects the antenna to a low noise amplifier (LNA) input where a signal from the antenna is amplified to then be processed further. By using a TX/RX switch, the same antenna can function as a TX antenna in the transmitting mode and as a RX antenna in the receiving mode.

In some embodiments, the TX/RX switch and/or associated circuitry also turn power to the PA and LNA on and off, as required. The TX/RX switch is typically a single pole double throw (SPDT) switch. In these typical embodiments, the TX/RX switch has a single output/input connected to the antenna, or an antenna connection. The TX/RX switch also has a TX input, typically connected to a PA output, and a RX output, typically connected to a LNA input. In the RX/receiving mode, the TX/RX switch (and/or associated circuitry) can power on the LNA while the TX/RX switch connects the antenna (or the antenna in receiving mode) to LNA input. The LNA output is connected to other components in the receiver/transceiver. in the TX mode, the TX/RX switch (and/or associated circuitry) can power on the power amplifier (PA) while the TX/RX switch connects the antenna (or the antenna in transmit mode) to the transmitter/transceiver output, e.g., through the PA output.

Generally, the antenna signal connections within the TX/RX switch are made through transmission lines. These transmission lines are often one quarter wavelength transmission lines or $\lambda/4$ transmission lines. Here, $\lambda$ is typically the wavelength at the operation frequency. These $\lambda/4$ transmission lines generally have a characteristic impedance that is close or equal to the input impedance of the antenna, or antenna impedance.

As a prior art example of a TX/RX switch, refer to FIG. 4 of "A 90-100-GHz 4 ×4 SiGe BiCMOS Ploarimetric Transmit/Receive Phase Array with Simultaneous Receive-Beams Capabilities" by Faith Golcuk, et al., IEEE Transactions on Microwave Theory and Techniques, Vol. 61, No.8, Aug. 2013, (Golcuk). Goluck shows a circuit diagram and a circuit layout of a typical embodiment of a TX/RX switch. In Golcuk, an antenna (ANT) connects to both a TX connection (during transmission mode) and an RX connection (during reception mode). In the transmission mode, the antenna is connected to the TX port through a ¼ wavelength ($\lambda/4$) transmission line while the RX port is shorted to ground with VC=VDD. This presents a high impedance to the antenna with a $\lambda/4$ impedance transformer. In a reception mode, the antenna is connected to the RX port through a ¼ wavelength ($\lambda/4$) TX transmission line while the TX port is shorted to ground with VC=0. This presents a high impedance to the antenna with a 214 impedance transformer.

As a second prior art example of a TX/RN switch, refer to FIG. 1 of "On the Analysis and Design of Low-Loss Single-Pole Double-Throw W-Band Switches Utilizing Saturated SiGe HBTs" by Robert L. Schmid, et al., IEEE Transaction on Microwave Theory and Techniques, Vol. 62, No. 11, November 2014 (Schmid). Schmid shows an alternate embodiment of a conventional quarter wave-length TX/RX switch implementation using nFET switching devices in combination with the $\lambda/4$ TX transmission lines. Here the "Common Port" (antenna input) connects the antenna through a first ¼ wavelength ($\lambda/4$) transmission line to "Switch Port 1" while a "Switch Port 2" is shorted to ground and presents a high impedance to the antenna with a $\lambda/4$ impedance transformer. Alternatively, the circuit connects the antenna through a second ¼ wavelength ($\lambda/4$) transmission line to "Switch Port 2" while shorting "Switch Port 1" to ground. This presents a high impedance to the antenna with a 214 impedance transformer.

Both Golcuk and Schmid show embodiments which disclose TX/RX switches connecting a first ¼ wavelength ($\lambda/4$) transmission line while shorting the output of a second 1/4 wavelength ($\lambda/4$) transmission line to ground. The prior art also discloses embodiments of TX/RX switches implementing a switching of a single ¼ wavelength ($\lambda/4$) transmission line, i.e., one-sided switching. See "A Fully-Integrated Dual-Polarization 16-Element W-band Phased-Array Transceiver" in SiGe BiCMOS by Alberto Valdes-Garcia, et al., 978-1-4673-6062-3/13, 2013 IEEE (Valdes-Garcia).

These prior art TX/RX switches and those of similar design suffer from power loss/dissipation from the PA and/or to the LNA due to the insertion of the transmission line(s) and/or the TX/RX switch components in one or more respective connections/configurations of the switching circuitry. These "insertion losses" deteriorate the performance in the transmission and/or reception modes. This performance deterioration includes degradation of a "noise figure" (NF) in the RX mode and degradation of output power level and efficiency in the TX mode.

In much of the prior art, these insertion losses introduce a non-negligible loss in both the LNA and PA connection paths. These insertion losses become more significant at higher frequencies, (and associated wavelengths, $\lambda$). In addition, in conventional designs, an impedance transformation based on a quarter wavelength transmission line has a limited. bandwidth which limits bandwidth range of operation of the TX/RX switch.

Also, quarter wavelength transmission lines in the conventional semiconductor TX/RX switching topology occupy a large die area, which increases the cost and size of semiconductor chips.

There is a need for TX/RX switches with improved insertion loss and wider operational bandwidth that can be embedded effectively in semiconductor circuits with a small form factor.

SUMMARY

According to an embodiment of the present invention, a transmit/receive (TX/RX) switch has a power amplifier (PA) output matching (PA-OM) network (or power matching network, PAM), a Low-Noise Amplifier (LNA) input matching network (LNA-IM or Low-Noise Amplifier Matching, LNAM, network), and a mode switch.

The PA-OM network has a PA network impedance. In a transmitting mode, the mode switch connects a common impedance with the PA network impedance to make a transmitting series-parallel combination. Various embodiments of the transmitting series-parallel combination match an antenna impedance to a PA-OM (PAM) network output impedance of the PA-OM while matching a PA-OM (PAM)

network input impedance of the PAM-OM to a power amplifier (PA) output impedance. These transmitting series-parallel combinations optimize the power transferred from the PA to the antenna in the transmitting mode.

The Low-Noise Amplifier (LNA) input matching LNA-IM (or LNAM) network has a LNA. network impedance, LNAN. In a receiving mode, the mode switch connects the same common impedance with the LNAN to make a receiving series-parallel combination. Various embodiments of the receiving series-parallel combination match a LNA input of the LNA to an LNA-IM output and the antenna impedance to an LNA-IM input These receiving series-parallel combinations optimizes the LNA noise figure and power matching.

Accordingly, the common impedance is common to, i.e., used by both, the LNA-IM (LNAM) network and the PA-OM network in different series-parallel combinations configured by the state of the mode switch.

Embodiments of the PA-OM (PAM) and LNA-IM (LNAM) in TX/RX switches are embedded in semiconductors. The common impedance removes the need for embedding transmission lines in the semiconductors and enables embedding semiconductor TX/RX switches with a much smaller size.

Design constraints, design methods, and TX/RX switch operating methods are disclosed.

BRIEF DESCRIPTION OF THE DRAWINGS

Various embodiments of the present invention will be described below in more detail, with reference to the accompanying drawings, now briefly described. The Figures show various apparatus, structures, components, circuits, component combinations, and related method steps of the present invention.

DETAILED DESCRIPTION

Figures 1A, 1B:
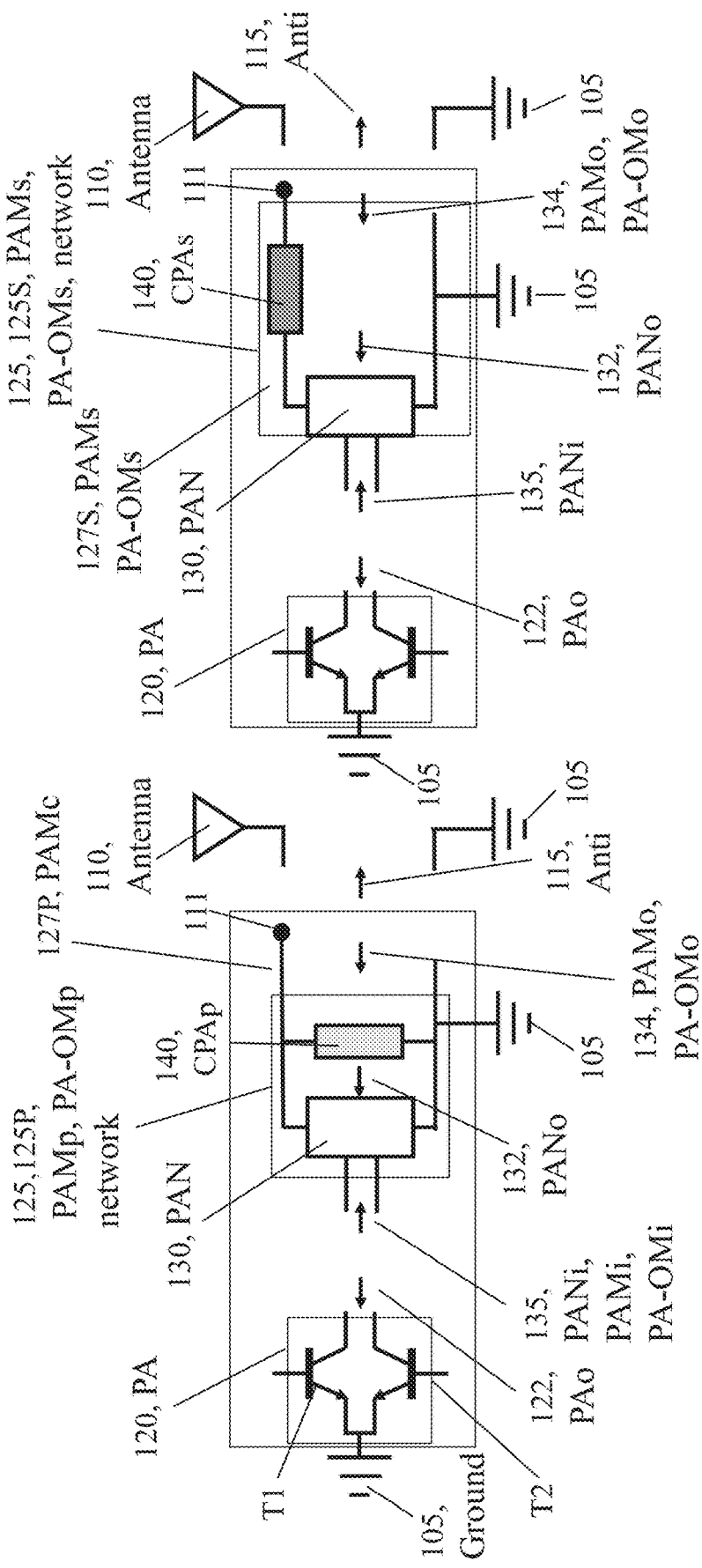
FIG. 1A is a block diagram of a partial TX/RX switch configuration in a transmitting mode with a power amplifier (PA) output matching, PA-OM (PAM), network including a common impedance (CPAp) in parallel combination with a PA network impedance, and where TX/RX switch components are shown disconnected to reveal look-in impedances.
FIG. 1B is a block diagram of a partial TX/RX switch configuration in a transmitting mode with a power amplifier (PA) output matching network including a common impedance (CPAs) in series combination with a PA network impedance, and where TX/RX switch components are shown disconnected to reveal look-in impedances.

It is to be understood that embodiments of the present invention are not limited to the illustrative methods, apparatus, structures, systems and devices disclosed herein but instead are more broadly applicable to other alternative and broader methods, apparatus, structures, systems and devices that become evident to those skilled in the art given this disclosure.

In addition, it is to be understood that the various components, structures, and/or regions shown in the accompanying drawings are not drawn to scale, and that one or more components, circuits, structures, and/or regions of a type commonly used may not be explicitly shown in a drawing. This does not imply that the components, circuits, structures, and/or regions not explicitly shown are omitted from the actual devices.

In addition, certain elements may be left out of a view for the sake of clarity and/or simplicity when explanations are not necessarily focused on such omitted elements. Moreover, the same or similar reference numbers used throughout the drawings are used to denote the same or similar features, elements, components, or structures, and thus, a detailed explanation of the same or similar features, elements, or structures will not be repeated for each of the drawings.

The semiconductor devices, structures, and methods disclosed in accordance with embodiments of the present invention can be employed in applications, hardware, communication, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, expert and artificial intelligence systems, functional circuitry, neural networks, etc. Systems and hardware incorporating the semiconductor devices and structures are contemplated embodiments of the invention.

As used herein, "height" refers to a vertical size of an element (e.g., a layer, trench, hole, opening, etc.) in the cross-sectional or elevation views measured from a bottom surface to a top surface of the element, and/or measured with respect to a surface on which the element is located.

Conversely, a "depth" refers to a vertical size of an element (e.g., a layer, trench, hole, opening, etc.) in the cross-sectional or elevation views measured from a top surface to a bottom surface of the element. Terms such as "thick", "thickness", "thin" or derivatives thereof may be used in place of "height" where indicated.

As used herein, "lateral," "lateral side," "side," and "lateral surface" refer to a side surface of an element (e.g., a layer, opening, etc.), such as a left or right-side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawings/figures. For example, as used herein, "vertical" refers to a direction perpendicular to the top surface of the substrate in the elevation views, and "horizontal" refers to a direction parallel to the top surface of the substrate in the elevation views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop," "disposed on," or the terms "in contact" or "direct contact" means that a first element and a second element are connected without any intervening elements, such as, for example, intermediary conducting, insulating or semiconductor layers, present between the first element and the second element.

It is understood that these terms might be affected by the orientation of the device described. For example, while the meaning of these descriptions might change if the device was rotated upside down, the descriptions remain valid because they describe relative relationships between features of the invention.

Embodiments of the present invention are embedded on/within a semiconductor chip, e.g., on the surface of a semiconductor substrate and/or within the substrate, by known semiconductor manufacturing techniques.

Embodiments of the TX/RX switch include a power amplifier (PA), a Low Noise Amplifier (LNA), a power amplifier (PA) output matching (PA-OM) network, a Low-Noise Amplifier (LNA) input matching network (LNA-IM), a mode switch, and an antenna connection.

The PA has a PA output with a PA output impedance. The PA output is connected to a PA-OM network input. The PA-OM network has a PA-OM network output that is connected to the antenna connection in one of one or more different switchable configurations. The PA-OM network has a PA network impedance and a common impedance. The PA network impedance and the common impedance can be connected in different transmitting series-parallel combinations by the mode switch.

The LNA has a LNA input with a LNA input impedance. A LNA input is connected to a LNA input matching network (LNA-IM) output. An LNA-IM network input is connected to the antenna connection in one of one or more different switchable configurations by the mode switch. The LNA-IM network has a LNA network impedance. The LNA network impedance and the common impedance can be connected in different receiving series-parallel combinations by the mode switch in different embodiments.

The mode switch uses/configures the same common impedance when configuring the PA network impedance in the transmitting mode and when configuring the LNA-IM network in the receiving mode.

Again, the mode switch in different configurations can connect the common impedance in one or more series/parallel combinations with the PA network impedance and/or with the LAN network impedance depending on whether the mode switch is in the transmitting or receiving mode/position. In some embodiments, the mode switch can also turn power on or off to the PA and/or the LNA.

Accordingly, with specific design limitations on the PA network impedance, common impedance, and LNA network impedance combined with various mode switch configurations of one or more of the TX/RX switch components, the TX/RX switch operates within a design bandwidth to optimally transfer power to or from the antenna. In addition, the TX/RX switch can be embedded in a semiconductor chip without transmission lines being embedded with the TX/RX switch circuitry. In either the TX or RX mode, the maximum power is transferred to/from the antenna.

As described below, the common impedance can be in different configurations and can have different values as determined by the configuration of the mode switch, the TX/RX switch circuit design, the value of the PA network impedance, and the LAN network impedance.

Refer now to the Figures.

FIG. 1A is a block diagram of a partial TX/RX switch configuration embodiment 100 in a transmitting mode with a power amplifier (PA) 120 output matching (PA-OM) network 125/125P including a common PA-LNA impedance, CPA/CPAp, 140 connected 127P in a parallel combination with a PA network impedance, PAN 130, where TX/RX switch components 120/125/125P/110/105/140 are shown disconnected to reveal look-in impedances 122/135/132/134/115.

FIG. 1B is a block diagram of a partial TX/RX switch configuration alternative embodiment 150 in a transmitting mode with a power amplifier (PA) 120 matching network (PA-OM) 125/125S including a common PA-LNA impedance, CPA/CPAs 140, in series combination with a PA network impedance, PAN 130, where TX/RX switch components 120/125/125S/110/105/140 are shown disconnected to reveal look-in impedances 122/135/132/134/115.

In some embodiments, the antenna 110 has a look-in or input impedance, Anti, 115 that can vary with the operating frequency (the frequency at which the antenna 110 is excited), the transmission line (not shown) connecting the antenna 110 to the antenna connection 111, the power amplifier output matching network 125/125P/125S, and/or other factors. In some embodiments, the transmission line connects the antenna 110 input, Anti, 115 to the power amplifier output matching network 125/125P/125S output, PA-OMo/PAMo 134 through the antenna connection 111.

In some embodiments, the look-in output impedance, PA-OMo, 134 of the power amplifier output matching network, PA-GM 125 output PA-OMo 134 matches (or is the same as) the antenna 110 input impedance, Anti, 115 at the system operating frequency (e.g., the resonance frequency of the antenna 110). Under this impedance matching condition, the maximum power is transferred from the PA 120 to the antenna 110 in the transmitting modes shown in FIGS. 1A and 1B, assuming the impedances are matched at other circuit locations, as described below.

In some embodiments, components including the PA 120, PA output matching network, PA-OM, 125, and antenna 110 are connected to a common connection 105 or ground 105 by well-known techniques.

The power amplifier (PA) 120 output matching (PA-0141) network 125/125P/125S includes a PA network impedance, PAN, 130. The PA-OM network 125/125P/125S has a PA-OM network input, PA-OMi 135, that has a PA output matching network input impedance, PA-OMi 135, and a PA output matching network output, 134 that has a PA network output impedance, PA-OMo 134.

In some embodiments, the PA output matching network input 135 is the same connection as a parallel connection across the PAN 130. The PA-OM input (PAMi/PA-OMi) 135 interfaces with a PA output connection, PAo 122. The PA 120 output connection 122 has a PA 120 output impedance, PAo 122.

The PA output matching network 125/125P/125S output PA-OMo 134 is connected to the antenna 110 input, Anti, 115 though the antenna connection 111 and ground connection 105.

In some embodiments, in the transmission mode, the antenna 110 input impedance, Anti, 115 (and/or the external transmission line (not shown) impedance, connects to the antenna 110 input 115 to the antenna connection 111) and matches the PA output matching network 125/125P/125S output impedance, PA-OMo 134. In addition, the PA-OM network 125/125P/125S input impedance, PA-OMi 135, matches the PA 120 output connection/impedance, PAo 122. In this way, in the transmitting mode, the output 122 of the PA 120 transfers the maximum power from the PA 120 to the PA matching output network, PA-OM 125/125P/125S, and then to the antenna 110, The mode switch configures the common PA-LNA impedance (CPAp/CPAs) 140 to achieve these matchings. See description below.

One way of viewing the PA-LNA. impedance (CPAp/CPAs) 140 is as a circuit or component with a physical property of impedance. Accordingly, reference to connecting an impedance, etc., means connecting the circuit/component with this impedance property, without loss of generality.

In the embodiment 100 shown in FIG. 1A, the PA-OMp 125/125P includes the PA network impedance, PAN, 130 connected with the common PA-LNA impedance, CPAp 140 in a parallel combination by a common, parallel PA impedance connection, PAMc 127P, In this embodiment, in the transmitting mode, the PA output, PAo 122, the PA output matching network, PA-OM 125/125P, and the antenna 110 are connected in parallel with the respective impedances matching as described above to provide the maximum power transfer from the PA 120 to the antenna 110.

In the alternative embodiment 150 shown in FIG. 1B, the PA-OMs 125/125S includes the PA network impedance, PAN, 130 connected with the common PA-LNA impedance, CPAs 140 in a series combination by a common, series PA impedance connection, PA-OMs 1275.

As is shown in these embodiments 100/150, the PA-OM 125 can include a PAN 130 connected with a common PA-LNA impedance 140, in a series, parallel, or series-parallel combination. The focus of these connections/combinations is that the impedances match at the input and output of the PA-OM 125 to permit maximum power transfer and/or other operating efficiencies. For example, when in transmitting mode, the following impedance pairs should match: Pao 122 matches PA-OMi 135 and PA-OMo 134 matches Anti 115. Note that the maximum power transfer occurs within the TX/RX switch due to these impedance matches, without the need for transmission lines within the TX/RX switch circuitry.

Additional design considerations include other series-parallel combinations of the common PA-LNA impedance 140 by the mode switch, as described below.

The common component(s)140 (CPAp,CPAs) are the same, common impedance used with both the PA 120 and LNA 220 in both the transmitting and receiving modes, respectively, although the design value of the common impedance might vary with configuration. See FIG. 2. The common impedance 140 (CPAp/LNAs, CPAs/LNAp), are designed so that different mode switch positions configure the common impedance 140 either in a receiving mode series-parallel combination in the receiving mode or a transmitting mode series-parallel combination in a transmitting mode. The value of the common impedance 140 is determined to enable maximize power transfer from/to the antenna with a high signal-to-noise ratio over a large bandwidth. See further description below.

It is noted that in embodiments 100/150, in the transmitting mode, the PA 120 includes transistors T1 and T2 which illustrate a PA 120 with a differential back end, e.g., a "push-pull" configuration. The PA 120 can also be configured with a single-ended back-end output stage. Also, as is known, a PA signal(s) can be applied to the base connections of transistors T1 and T2. Other known PA 120 configurations are envisioned.

Figures 2A, 2B:
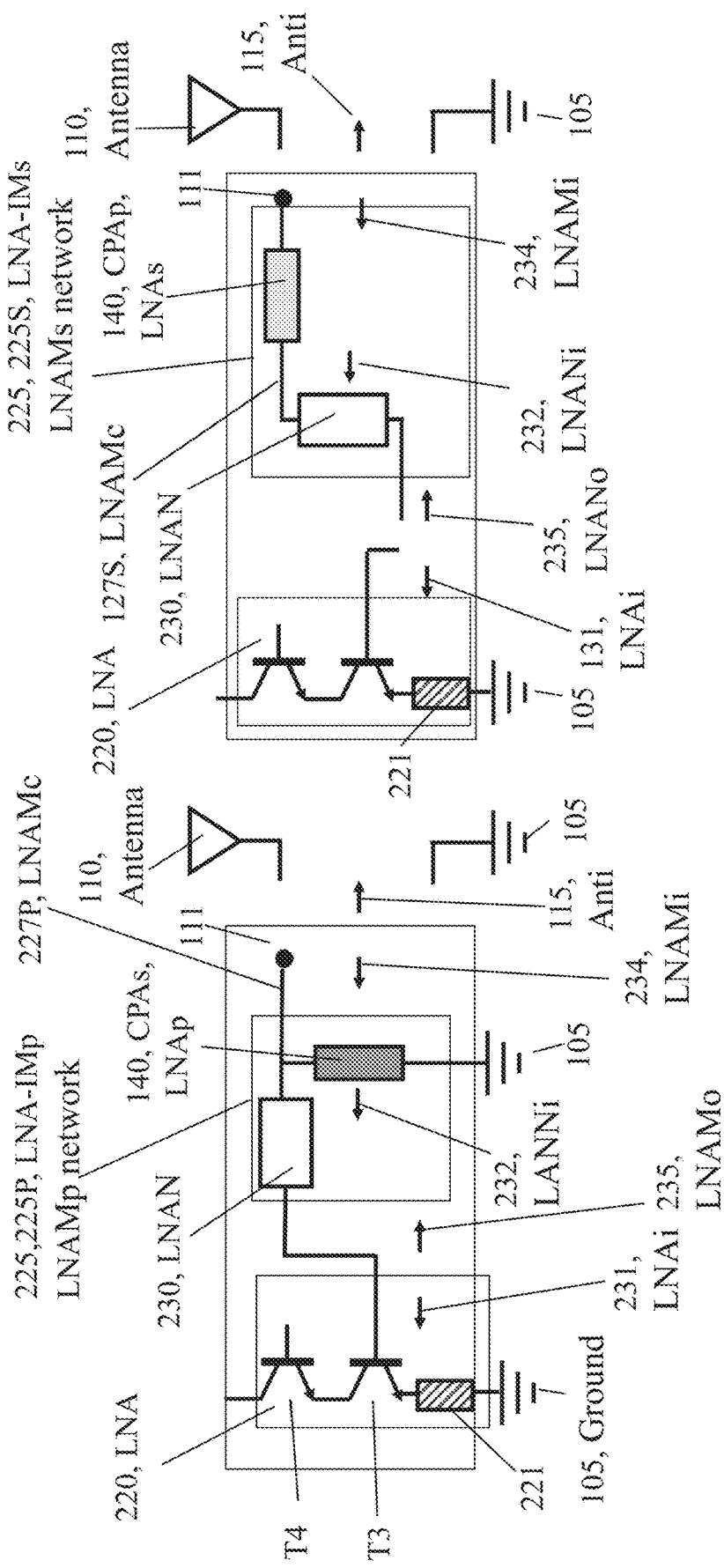
FIG. 2A is a block diagram of a partial TX/RX switch configuration in a receiving mode with a low noise amplifier (LNA) input matching network including the common impedance (CPAs/LNAp) in parallel combination with a LNA input (including a LNA network impedance), and where TX/RX switch components are shown disconnected to reveal look-in impedances.
FIG. 2B is a block diagram of a partial TX/RX switch configuration in a receiving mode with a low noise amplifier (LNA) input matching network including the common impedance (CPAs/LNAs) in series combination with a LNA input (including a LNA network impedance), where TX/RX switch components are shown disconnected to reveal look-in impedances.

FIG. 2A is a block diagram of a partial TX/RX switch configuration 200 in a receiving mode embodiment including a low noise amplifier (LNA) 220, input matching network, LNA-IMp 225/225P including a common PA-LNA impedance, CPAs/LNAp 140 in parallel combination with a LNA network impedance, LNAN 230 where TX/RX switch components are shown disconnected to reveal look-in impedances 231/235/232/234/115.

FIG. 2B is a block diagram of a partial TX/RX switch configuration 250 in a receiving mode alternative embodiment with a low noise amplifier (LNA) 220 input matching network, LNA-IMs, 225/225S including a common PA-LNA impedance, CPAp/LNAs 140. In this embodiment, the common PA-LNA impedance, CPAp/LNAs 140 is in series combination with a LNA network impedance, LNAN 230. The TX/RX switch components are shown disconnected to reveal look-in impedances 231/235/232/234/115, In some embodiments, the LNA network impedance, LNAN 230, is eliminated.

It is noted that the LNA 220 shows transistors T3 and T4 are in a differential input configuration. The LNA 220 can also be configured with a single transistor, e.g., single T3 input stage. Other known LNA 220 configurations are envisioned. In some embodiments, the LNA 220 has an input stage impedance 221 that may affect the LNA 220 input impedance, LNAi 231.

In the receiving mode, power from the antenna 110 is transferred through the low noise amplifier (LNA) 220 input matching network, LNA-IM, 225/225S/225P to the LNA 220 input, LNAi 231.

As noted, in the embodiment 200, the LNA network impedance LNAN 230 is connected in a receiving parallel combination with the common PA-LNA impedance, LNAp/CPAs, 140. Also, in the embodiment 250, the LNA network impedance, LNAN. 230 is connected in a receiving series combination, in series with the common PA-LNA impedance, CPAp/LNAs 140. Other series-parallel combinations in the LNA 220 input matching network, LNA-IM 225/225S/225P are envisioned that enable a maximum power transfer, an improved noise figure, and an efficient TX/RX switch operation in each of the one or more mode switch combinations described below.

Figure 3:
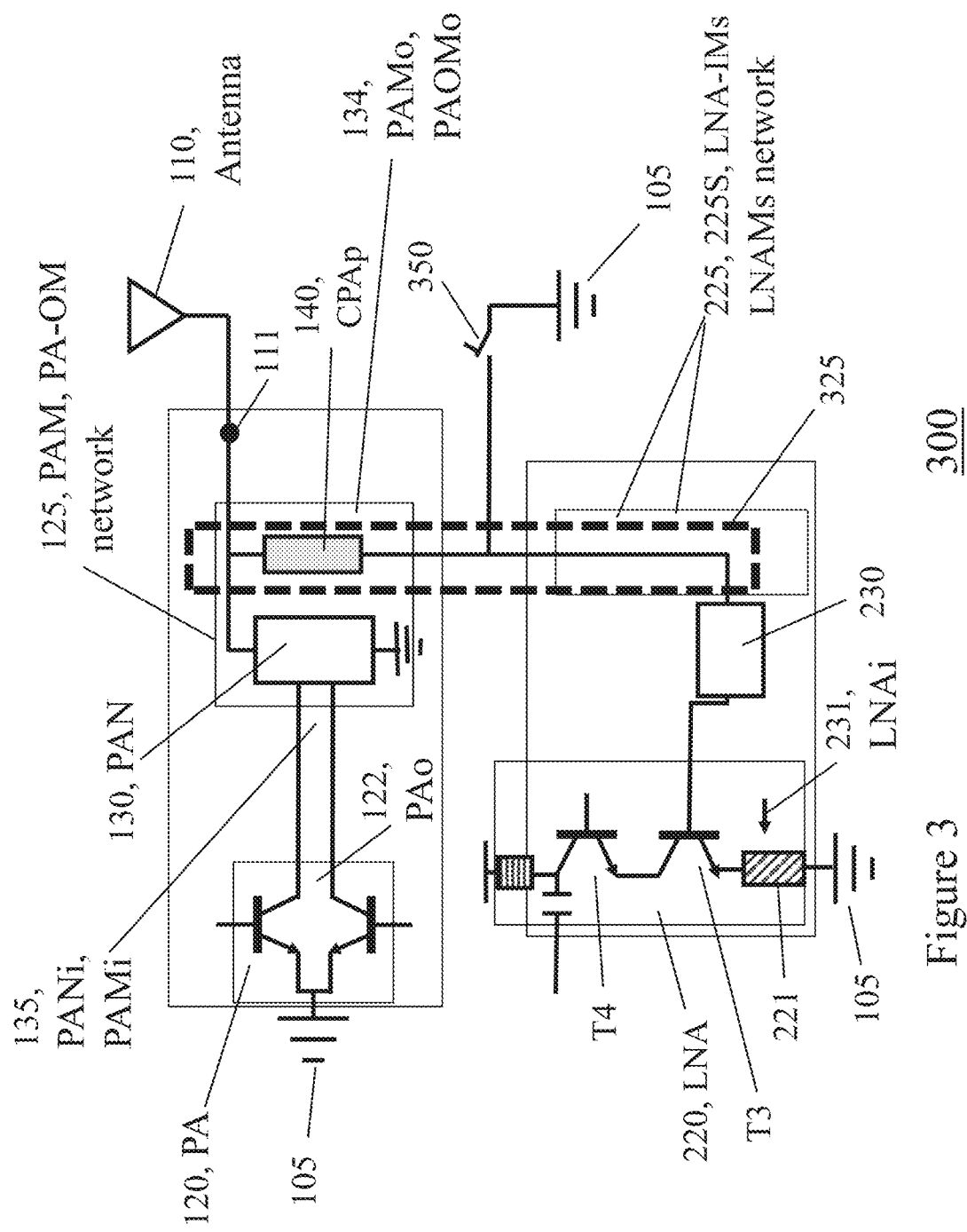
FIG. 3 is a block diagram of one TX/RX switch configuration embodiment with connected components illustrating how a mode switch connects the common impedance in series with the INA input (including a LNA network impedance) in a receiving mode (mode switch open) and connects the common impedance in parallel with the PA network impedance in a transmitting mode (mode switch closed).

FIG. 3 is a block diagram of one TX/RX switch configuration embodiment 300 with a mode switch 350 in an open position, in a receiving mode configuration with connected components. The mode switch 350 can connect the common PA-LNA impedance CPAp 140 in a receiving mode series-parallel combination 325 (in series) with the LNA network impedance, LNAN 230, in the receiving mode, RX.

The mode switch 350, e.g., in a closed position, connects the common PA-LNA impedance, CPAp 140 and the PA network impedance, PAN 130 in a parallel in a transmitting series-parallel combination 325 in a transmitting mode, TX. Therefore, by designing the common PA-LNA, CPAp/LNAs, impedance 140 within particular constraints determined by the series-parallel combinations and other configurations produced by a mode switch 350 configuration, the input and/or output impedances of the PA-OM 125 and LNA-IM 225 change to optimize power transmission from/to the antenna 110 at the antenna connection 111, in the respective RX and TX modes, without the need for transmission lines within the TX/RX switch.

For example, as shown in the embodiment 300 of FIG. 3, the mode switch is shown in the open position, which in this embodiment 300 places this embodiment of the TX/RX switch 300 in the receiving mode. In this configuration, the mode switch 350 connects the common PA-LNA impedance 140 in a receiving series-parallel combination 325 that connects the common impedance 140 in series with the LNA 220 network impedance, LNAN 230.

In some embodiments, digital controls/circuitry that control the mode switch 350 also control switching (not shown) that disconnects or powers down the PA 120 (and possible connects power to the LNA 220). With PA 120 powered off and the LNA 220 powered on, transistor T3 operates and this embodiment of the receiving series-parallel combination 325 combines the common impedance 140 in series with LNAN 230 and the LNA 220 input impedance, LNAi 231 (related to input stage impedance 221) through transistor T3 in an on state. Therefore, power from the antenna 110 connection 111 passes through a voltage divider circuit that includes impedances 140, 230, and 231 connected in series.

In some embodiments, once the value of the common PA-LNA impedance 140 is determined to meet the requirements herein disclosed, the LNAN 230, input stage impedance 221, transistor T3, and/or transistor T4 can be selected to reduce noise (lower S/N) and match impedances for maximum power transfer.

Alternatively, closing mode switch 350 places the TX/RX switch 300 in the transmitting mode. By closing the mode switch 350, input to the LNA 220 is shorted to ground. In this mode switch 350 position, the series-parallel combination 325 has the common impedance, CPAp 140, connected in parallel with PA network impedance, PAN 130, in a transmitting series-parallel combination 325. In this transmission mode, the PA matching network, PA-OM, 125 with input impedance, PA-OMi 135, and output impedances, PA-OMo 134, connects and matches the impedances of the PA output, PAo 122, with the input PA-OMi 135 and connects and matches the PA-OMo 134 with the antenna 110 input 115. Therefore, by designing the common PA-LNA impedance, CPAp 140 correctly, maximum power is provided from the PA 120 to the antenna 110 connection 111 within the operating bandwidth.

Figure 4:
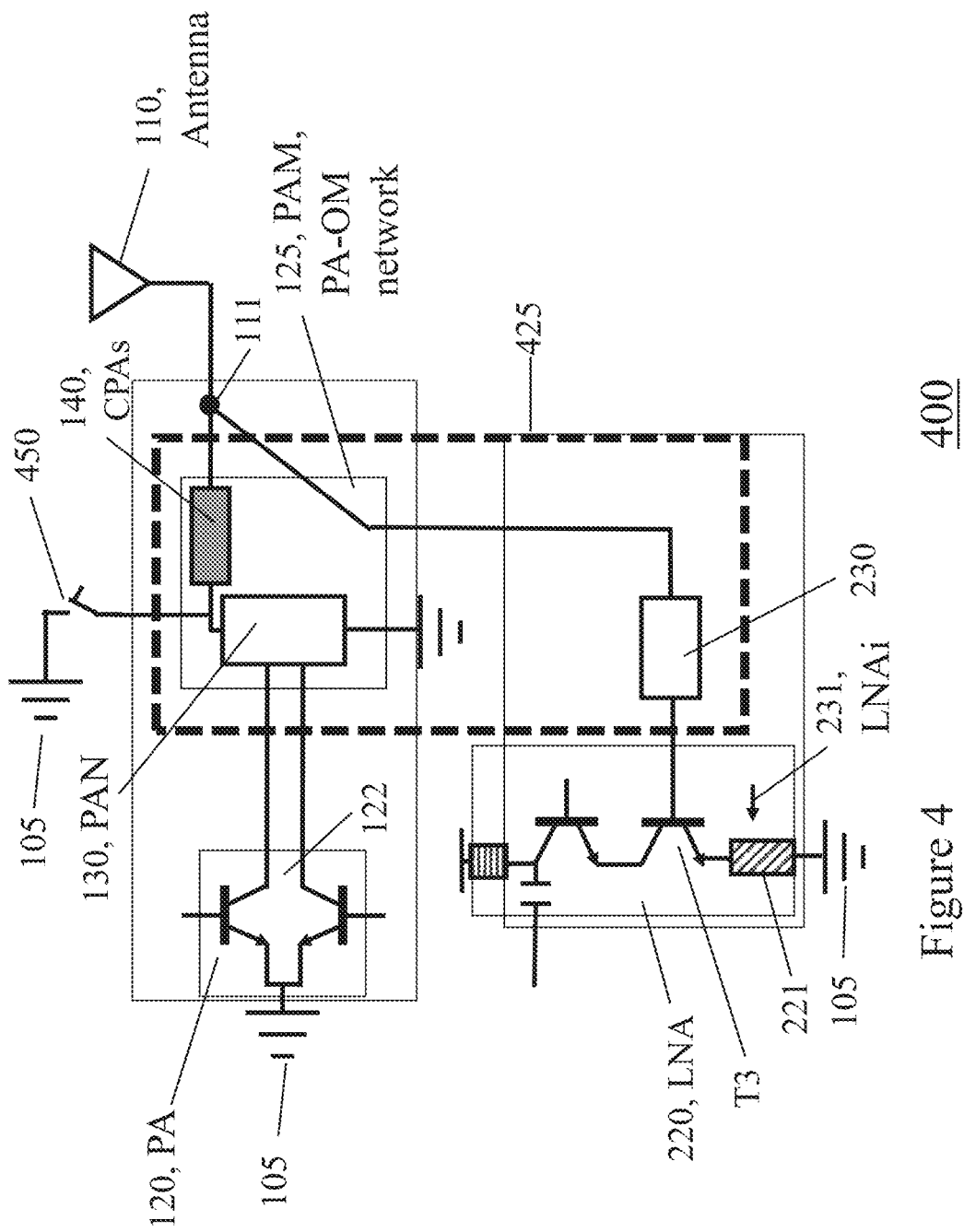
FIG. 4 is a block diagram of one TX/RX switch alternative configuration embodiment with connected components illustrating how a mode switch connects the common impedance in series with the PA network impedance in the transmitting mode (mode switch open) and connects the common impedance in parallel with the LNA input (including the LNA network impedance) in a receiving mode (mode switch closed).

FIG. 4 is a block diagram of one TX/RX switch configuration alternative embodiment 400 with connected components with the mode switch 450 at an alternate location in the configuration 400.

In this embodiment, when the mode switch 450 is in the closed position, the TX/RX switch 400 is in the receiving mode. See the description in FIG. 7. When the mode switch 450 is in the open position, the TX/RX switch 400 is in the transmitting mode. See the description of FIG. 8.

For example, in some embodiments of the receiving mode, the power is switched off to the PA 120 and switched on to the LNA 220, putting transistor T3 in operation. In this receiving mode configuration, the closed mode switch 450 shorts the PAN 130 to ground. The closed mode switch 450 also connects the common PA-LNA impedance, CPAs 140 in parallel with the antenna 110 and with the series combination of the LNA network impedance, LNAN 230 and input impedance LNAi 231 (related to the input stage impedance 221). example, in this embodiment of the receiving mode, the configuration of the mode switch 450 makes the receiving series-parallel combination 425 of connecting the CPAs 140 in parallel with the series connection of LNAN 230 and the input impedance LNAi 231.

When the mode switch 450 is in the open position, the TX/RX switch 400 is in the transmitting mode. For example, in some embodiments, the LNA 220 is powered off and the PA 120 is powered on. The voltage across the PAN 130 creates an oscillating current in the antenna 110 through the common impedance CPAs 140.

Figures 5A, 5B:
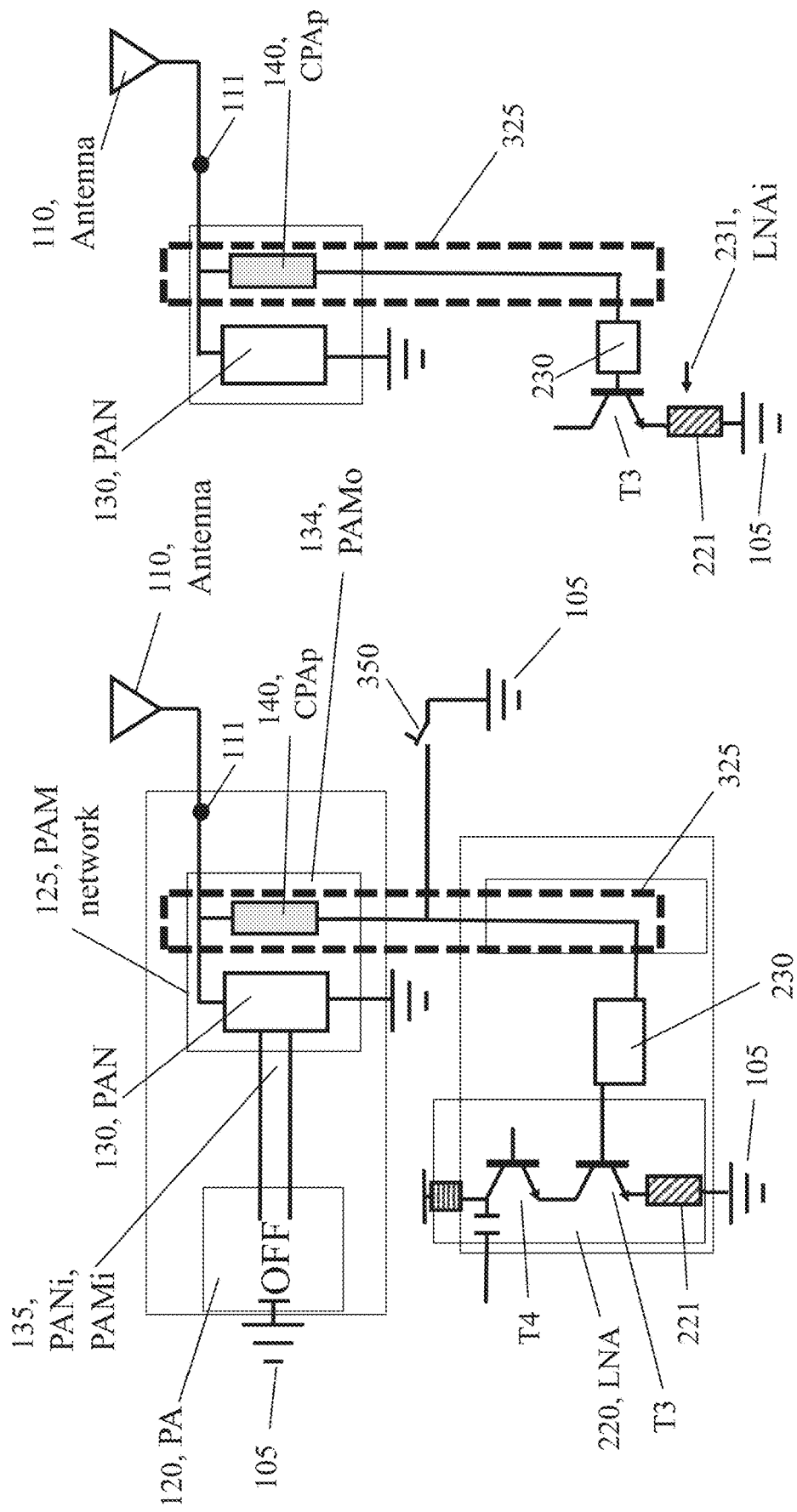
FIG. 5A is a block diagram of one TX/RX switch embodiment shown in FIG. 3 where the (open) mode switch configures a receiving mode, RX, and where the common impedance is designed to be in series with the LNA input (including the LNA network impedance) for noise and power matching.
FIG. 5B is a circuit diagram of an embodiment of the receiving mode series-parallel combination, shown in FIG. 5A, showing where the open mode switch connects the antenna, common impedance, and LNA input (including the LNA network impedance) in series.

FIG. 5A is a block diagram of one TX/RX switch embodiment 300 shown in FIG. 3 with the mode switch 350 (in the open position) configuring a receiving mode, RX, and where the common PA-LNA impedance, CPAp) 140 is designed for the receiving mode series-parallel combination 325. FIG. 5B is a circuit diagram of the receiving mode series-parallel combination 325 where the common PA-LNA impedance, CPAp, 140; LNA network impedance, LNAN 230; LNA 220 input impedance LNAi 231; and the antenna 110 are connected in series.

In some embodiments, the PA turned is OFF.

Figure 6:
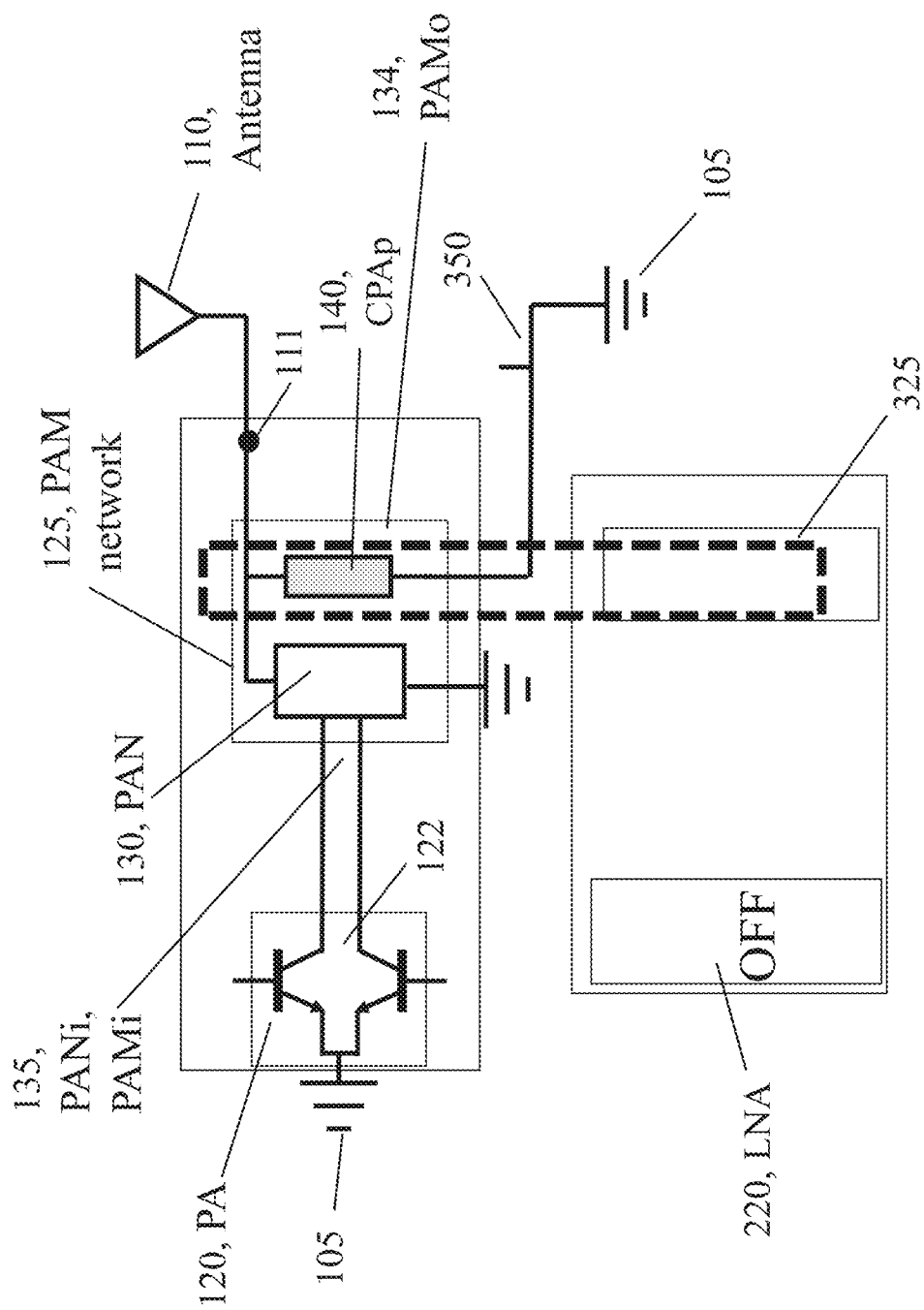
FIG. 6 is a block diagram of one TX/RX switch embodiments shown in FIG. 3 where the mode switch configures a transmitting mode, TX, and where the closed mode switch shorts the LNA input to ground and connects the common impedance in parallel with the PA network impedance.

FIG. 6 is a block diagram of one TX/RX switch embodiment 600 which is a simplification of the circuit shown in FIG. 3 in the transmitting mode. In this embodiment, the mode switch 350 is in the closed position, configuring the TX/RX switch in the transmitting mode. TX, and where components are designed for the transmitting mode and connected in the series-parallel combination 325.

The closed mode switch 350 shorts the LNAN 230 as well as input impedance LNAi 231 to ground. In some embodiments, the LNA 220 is powered off as well. The closed mode switch connects the PAM network 125; the PA output, PAo 122; and antenna 110 in parallel. Accordingly, in this transmitting mode, the transmitting series-parallel combination is the PA network (PAN) impedance 130 connected in parallel with the common PA-LNA impedance, CPAp 140, which are also connected in parallel with the PA 120 output PAo 122 and the antenna 110.

Figure 7:
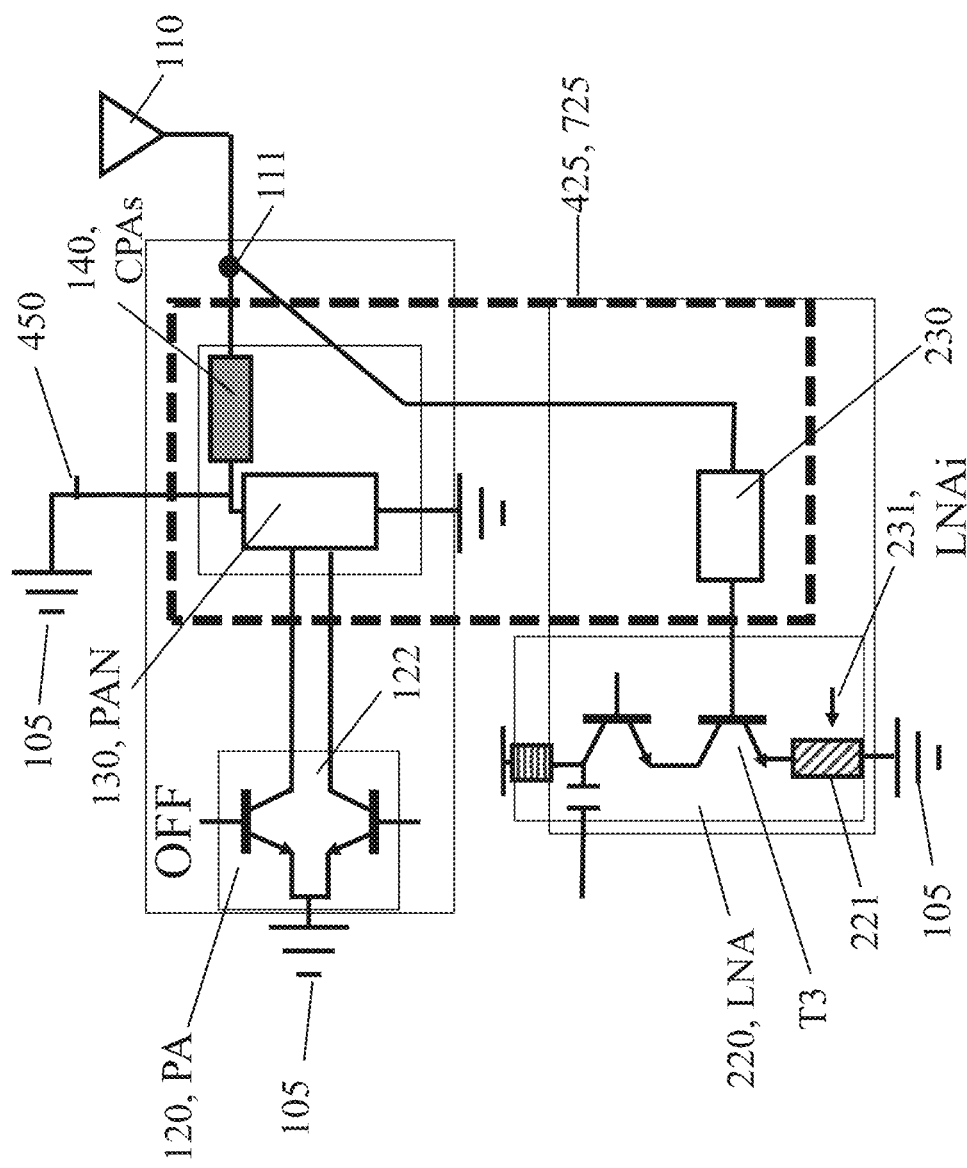
FIG. 7 is a block diagram of an alternative TX/RX switch embodiment shown in FIG. 4 where the (closed) mode switch configures a receiving mode by shorting the PA (network impedance) output to ground and connecting the common impedance in parallel with the LNA input (including the LNA network impedance).

FIG. 7 is a block diagram of an alternative TX/RX switch embodiment 700 shown in FIG. 4 with the mode switch 450 in the closed position, configuring a receiving mode, RX, and where components are designed and configured for the receiving mode series-parallel combination 425/725.

In this receiving mode series-parallel combination 425/725, the PA 120 can be powered off and the PA 120 output, PAo, 122 is shorted to ground. The input impedance LNAi 231, LNAN 230, and the antenna 110 are connected in series and are in turn connected in parallel across the common impedance CPAs 140.

Figure 8:
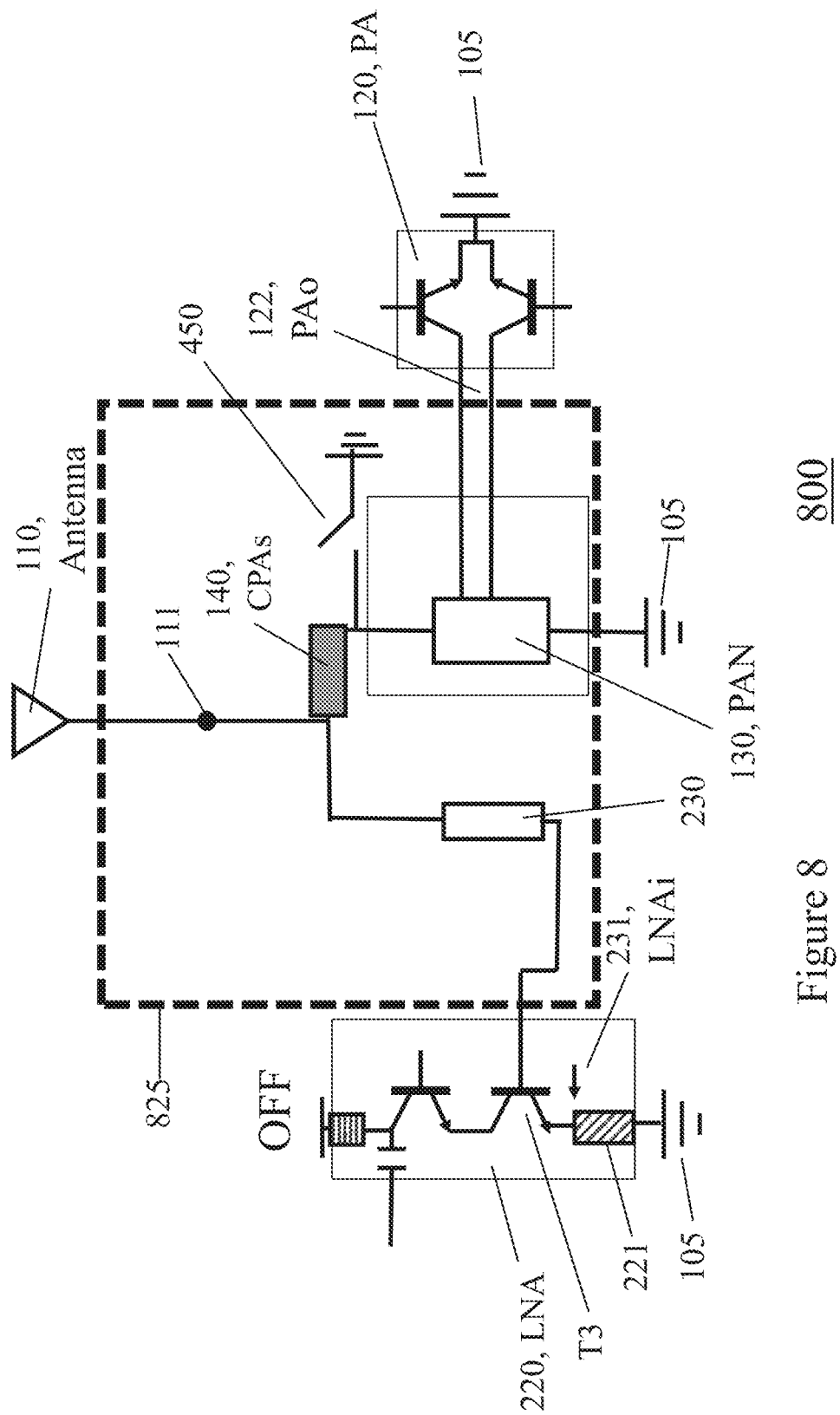
FIG. 8 is a block diagram of an TX/RX switch embodiment shown in FIG. 4 where the (open) mode switch configures a transmitting mode by connecting the common impedance in series with the PA network impedance with the LNA powered off

FIG. 8 is a block diagram of an TX/RX switch embodiment 800 shown in FIG. 4 with the mode switch 450 in the open position. The mode switch 450 is configuring a transmitting mode, TX, and where components are designed for and configured in the transmitting mode series-parallel combination 825. The LNA 220 can be powered off. The antenna 110, common impedance CPAs 140, and PA network impedance, PAN 130 are connected in series in this transmitting mode embodiment.

Figure 9:
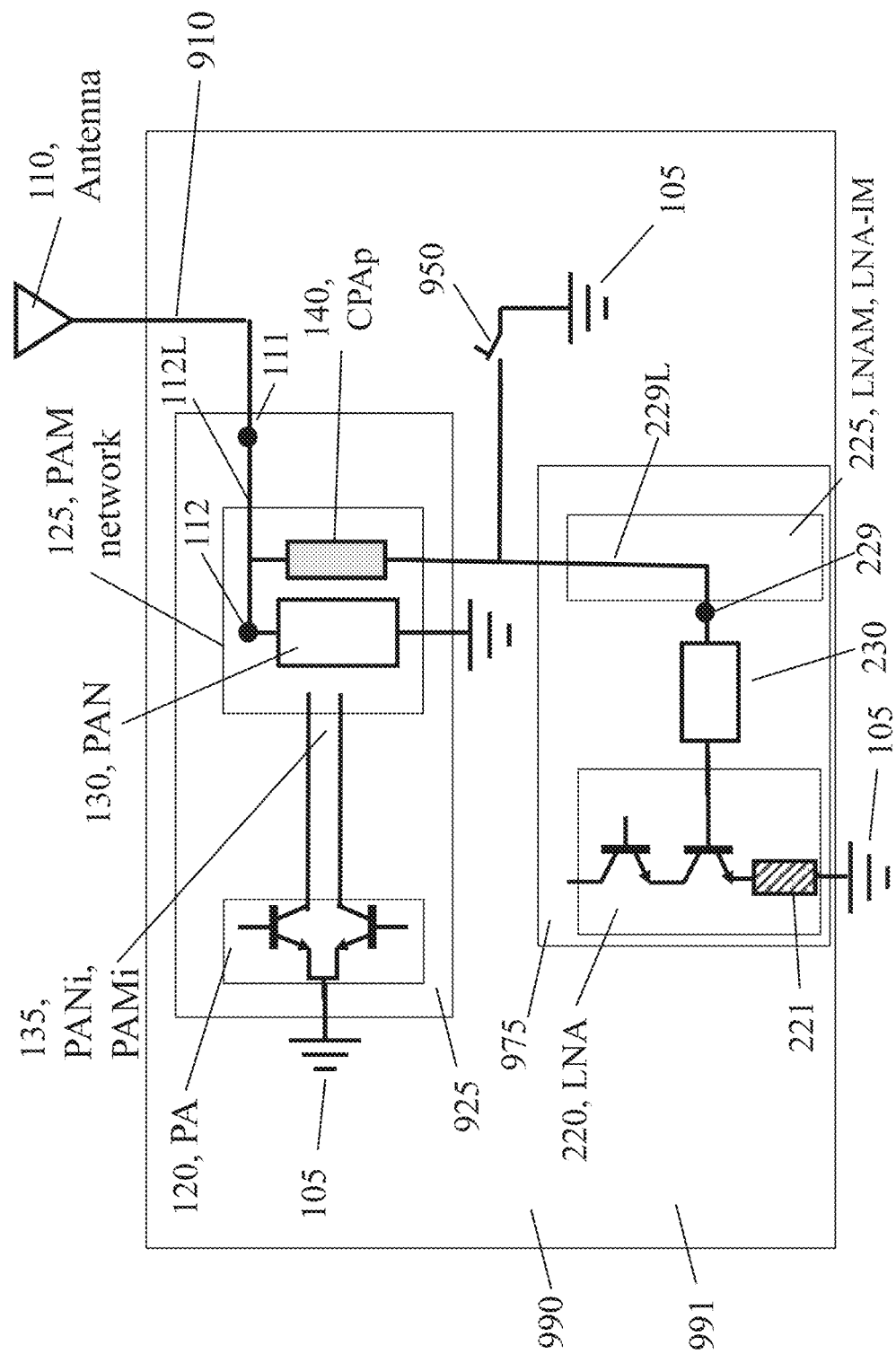
FIG. 9 is a block diagram of an example TX/RX switch embedded on a substrate, e.g., a semiconductor substrate, without the need to include transmission lines on the substrate.

FIG. 9 is a block diagram of an example TX/RX switch 900 embedded on a substrate 990, e.g., a semiconductor substrate 990. The TX/RX switch uses a minimum footprint surface 991 on the surface of the substrate 990.

The substrate 990 can be any compatible substrate known in the semiconductor industry, e.g., silicon dioxide, SiO2. The components PA 120, PA-OM/PAM 125, LNA 220, LNA-IM/LNAM 225, and mode switch 950 are embedded in/or on the substrate by known methods.

In one embodiment, a power module 925 contains the PA 120 and the PA-OM network 125 and a LNA module 975 contains the LNA 220 and the LNA-IM 225. The mode switch 950 can connect in any of the modes and configurations disclosed. Other configurations are envisioned that conform to the concepts disclosed here.

In some embodiments, the footprint surface 991 is minimized because transmission lines are not needed to match impedances between the antenna 110 and the power amplifier module 925 or between the antenna 110 and the LNA module 975. Switching 950 the common impedance 140 enables a wire connection between the antenna connection 111 and the PA network impedance, PAN 130 (PAN connection 112). In addition, switching 950 the common impedance 140 enables a wire connection between the antenna connection 111 and the LNA work impedance, LNAN 230 (LNAN connection 229).

The distance between the antenna connection 111 and the PAN connection 112 has a PAN connection length 112L. The distance between the antenna connection 111 and the LNA connection 229 has a LNA connection length 229L. The PAN length 112L and the LNA connection length 229L each have a length equal to or less than $\lambda/4$, i.e., a quarter of the wavelength in the substrate, $\lambda$, of the antenna operating frequency.

In some embodiments, the common component CPAp/CPAs 140 has a specific selected impedance value as defined by design conditions in the description above. Also, as described, the common components 140 are configured into respective receiving and transmitting series-parallel configurations by the mode switch 950 to maximize power transfer and minimize noise in the receiving and transmitting modes. Accordingly, there is no need to have transmission lines on or embedded within the substrate 990 to provide impedance matching of components. As a result, the size of the chip 950 can be substantially reduced.

Figure 10:
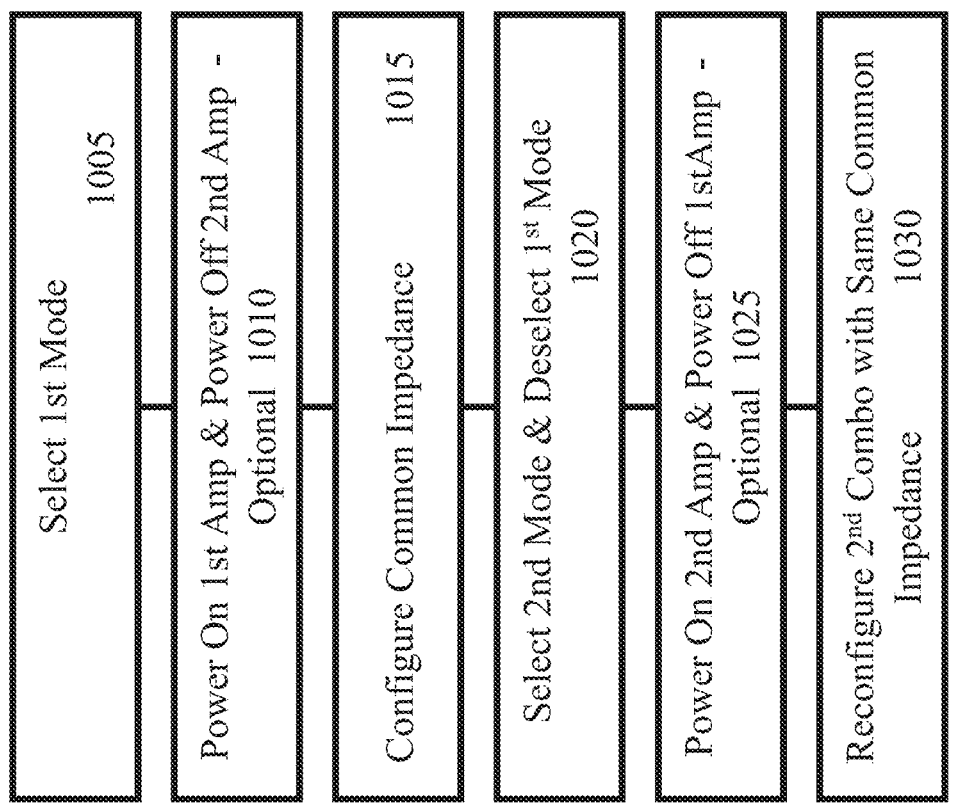
FIG. 10 is a flow chart of a switching process using a TX/RX switch.

It is noted that the connection between the antenna connection 111 on the substrate 990 and the antenna 110 is typically a transmission line 910. However, the transmission line 910 is external to the TX/RX switch embodiment 900 and does not use any space within the substrate 990/chip, FIG. 10 is a flow chart of a switching process 1000 using any of the TX/RX switch embodiments disclosed.

The switching process 1000 begins with step 1005 where a first mode, i.e., either a receiving mode or a transmitting mode, is selected by the mode switch 350/450/950.

Step 1010 is an optional step of powering; off the amplifier that is not used in the selected mode. For example, in the receiving mode, the PA 120 is powered off and in the transmitting mode, the INA 220 is powered off. The amplifier in use can also be powered on by the mode switch.

In step 1015 the mode switch 350/450/950 configures the common impedance 140 into the series-parallel combination that corresponds to the selected mode. For example, in the receiving mode the receiving series-parallel combination uses the common PA-LNA impedance, e.g., 140 and in the transmitting mode the transmitting series-parallel combination uses the same common PA-LNA impedance, e.g., 140.

In step 1020, the mode selection made by the mode switch 350/450/950 is changed. The first mode, e,g., the selected transmitting mode, is deselected and a second mode, e,g., the receiving mode is selected. The mode change is accomplished by changing the position of the mode switch. In some embodiments, the mode switch 350/450/950 is a switching transistor like a bipolar transistor or a metal oxide semiconductor transistor.

In some embodiments, the mode switch 350/450/950 is designed to be in the "off state" in one of the selected modes so that power to the mode switch 350/450/950 is only applied in one of the mode selections. In this manner, power is saved since the mode switch 350/450/950 is only needed/used in one of the (transmitting or receiving) modes.

Step 1025 is an optional step that powers off the amplifier 120/220 used in the deselected mode and powers on the amplifier 120/220 used in the most recently selected mode.

In step 1030 the mode switch 350/450/950 configures the same common impedance 140 into the series-parallel combination that corresponds to the newly/most recently selected mode. For example, if the newly/most recently selected mode is the receiving mode the receiving series-parallel combination is configured by the mode switch 350/450/950, optionally the PA 120 is powered off, and the transmitting series-parallel combination is unconfi glared.

The noise figure (NF) in the receiving mode (RX) and a PA compression point (i.e., output power) in transmitting mode (TX) are both improved because an additional $\lambda/4$ transmission line is not required for the switching operation between the RX and TX modes. Accordingly, extra insertion losses added by the $\lambda/4$ transmission lines used in the prior art are not experienced by using this invention and therefore the NF and output power are not degraded.

For example, mode switching in the prior art relies on using a switch to either short a $\lambda/4$ transmission line to ground or open the line to high impedance state. These transformations operate and are limited to a specific design frequency. However, the present invention avoids these limitations and operates over a broadband.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. Devices, components, elements, features, apparatus, systems, structures, techniques, and methods described with different terminology that perform substantially the same function, work in the substantial the same way, have substantially the same use, and/or perform the similar steps are contemplated as embodiments of this invention.

We claim:

1. A transmit/receive (TX/RX) switch comprising:
    a common PA-LNA impedance;
    a power amplifier (PA) output matching (PA-OM) network with a PA network impedance, the PA-OM network having a PA-OM network output with a PA-OM network output impedance and a PA-OM network input with a PA-OM network input impedance;
    a Low-Noise Amplifier (LNA) input matching (LNA-IM) network having a LNA network impedance, the LAN-IM network having a LAN-IM network input with a LNA-IM network input impedance and a LNA-IM matching network output with a LNA-IM matching network output impedance; and
    a mode switch that connects the common PA-LNA impedance in a receiving series-parallel combination in a receiving mode and disconnects the common PA-LNA impedance when not in the receiving mode,
    wherein:
    in the receiving mode, the mode switch configures the common PA-LNA impedance with the LNA network impedance in the receiving series-parallel combination so the LNA-IM network output impedance matches a LNA input impedance of a low noise amplifier (LNA) and the LNA-IM input impedance matches an antenna impedance and so a LNA noise figure is reduced.

2. The TX/RX switch, as in claim 1, where the common PA-LNA impedance connects in parallel with the PA network impedance.

3. The TX/RX switch, as in claim 1, where the common PA-LNA impedance connects in series with the PA network impedance.

4. The TX/RX switch, as in claim 1, where the mode switch shorts the LNA network impedance to ground in the transmitting mode.

5. The TX/RX switch, as in claim 1, where the mode switch turns power off to the LNA in the transmitting mode.

6. The TX/RX switch, as in claim 1, where the mode switch shorts the PA network impedance to ground in the receiving mode.

7. The TX/RX switch, as in claim 1, where the mode switch turns power off to the PA in the receiving mode.

8. The TX/RX switch, as in claim 1, where the mode switch connects the PA network impedance, the common PA-LNA impedance, and an antenna connection in parallel in the transmitting mode.

9. The TX RX switch, as in claim 1, where the mode switch connects an antenna connection, the common PA-LNA impedance, and the LNA network impedance in series.

10. The TX/RX switch, as in claim 1, where the mode switch connects an antenna connection and the common PA-LNA impedance in parallel with the LNA network impedance.

11. The TX/RX switch, as in claim 10, where the mode switch turns power off to the PA in the receiving mode.

12. A transmit/receive (TX/RX) switch embedded in a semiconductor chip, the switch comprising:
    a semiconductor substrate;
    an antenna connection;
    a common PA-LNA impedance;
    a power amplifier (PA) section disposed on the substrate, the PA section comprising:
        a PA with a PA output impedance;
        a power amplifier (PA) output matching (PA-OM) network with a PA network impedance, the PA-OM network having a PA-OM network output with a PA-OM network output impedance and a PA-OM network input with a PA-OM network input impedance;
    a Low-Noise Amplifier (LNA) section embedded on the substrate, the LNA section comprising:
        a Low-Noise Amplifier (LNA) with a LNA input, the LNA input having an LNA input impedance;
        a Low-Noise Amplifier (LNA) input matching (LNA-IM) network having a LNA network impedance, the LAN-IM network having a LAN-IM network input with a LNA-IM network input impedance and a LNA-IM matching network output with a LNA-IM matching network output impedance; and
    a mode switch that connects the common PA-LNA impedance in a receiving series-parallel combination in a receiving mode and disconnects the common PA-LNA impedance when not in the receiving mode,
    wherein:
    in the receiving mode, the mode switch configures the common PA-LNA impedance with the LNA network impedance in the receiving series-parallel combination so the LNA-IM network output impedance matches a LNA input impedance of a low noise amplifier (LNA) and the LNA-IM input impedance matches an antenna impedance and so a LNA noise figure is reduced.

13. The switch, as in claim 12, where a LNA connection length is the length of a connection between the antenna connection and a LNA connection and a PAN connection length is the length of the connection between the antenna connection and a PAN connection, and the LNA connection length and the PAN connection length each are shorter than a quarter of the wavelength in the substrate of an antenna operating frequency.

14. The switch, as in claim 12, where a transmission line connects the antenna connection to an antenna.

15. The switch, as in claim 12, where the PA is powered off in the receiving mode.

16. The switch, as in claim 12, where the LNA is powered off in the transmitting mode.

17. The switch, as in claim 12, where the mode switch only uses energy when the switch is not in the transmitting mode but in receiving mode.

18. The switch, as in claim 12, where the mode switch shorts the LNA, network impedance to ground in the transmitting mode.

19. The switch, as in claim 12, where the mode switch shorts the PA network impedance to ground in the receiving mode.

* * * * *